US007095356B1

(12) United States Patent
Pentakota et al.

(10) Patent No.: US 7,095,356 B1
(45) Date of Patent: Aug. 22, 2006

(54) PROVIDING REFERENCE VOLTAGE WITH DESIRED ACCURACY IN A SHORT DURATION TO A DYNAMICALLY VARYING LOAD

(75) Inventors: Visvesvaraya A Pentakota, Bangalore (IN); Abhaya Kumar, Bangalore (IN); Raghu Nandan Srinivasa, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/162,695

(22) Filed: Sep. 20, 2005

(51) Int. Cl.
*H03M 1/12* (2006.01)
(52) U.S. Cl. ........................ 341/172; 341/150
(58) Field of Classification Search .............. 341/172, 341/143, 150
See application file for complete search history.

(56) References Cited

U.S. PATENT DOCUMENTS 6,628,217 B1 * 9/2003 Dunne ........................ 341/143
6,888,358 B1 * 5/2005 Lechner et al. ............. 324/607
6,894,632 B1 * 5/2005 Robinson .................... 341/143

* cited by examiner

*Primary Examiner*—Rexford Barnie
*Assistant Examiner*—Joseph Lauture
(74) *Attorney, Agent, or Firm*—Warren L. Franz; W. James Brady, III; Frederick J. Telecky, Jr.

(57) ABSTRACT

Simplifying the design of buffer amplifier circuits to provide reference voltages of desired characteristics on a path. Two separate circuits may be used to provide the necessary charging (of a load connected to the path) in non-overlapping time durations. In an embodiment in which the load comprises sampling capacitors of a stage of an analog to digital converter (ADC), each of the two circuits contains a corresponding charging capacitor, with the charging capacitors charging the load in non-overlapping time durations of a hold phase. The first charging capacitor may be charged using a coarse buffer with a high drive strength and the second charging capacitor may be charged using a fine buffer with high accuracy.

22 Claims, 9 Drawing Sheets

PROVIDING REFERENCE VOLTAGE WITH DESIRED ACCURACY IN A SHORT DURATION TO A DYNAMICALLY VARYING LOAD

BACKGROUND

1. Field of the Invention

The present invention relates generally to the design of buffers providing constant voltage, and also to its application in the design and implementation of a multi-stage ADC.

2. Related Art

Buffer amplifier circuits (buffer) are often employed to provide a desired constant reference voltage. In general, a buffer receives a constant voltage from a constant voltage source such as band-gap reference, and generates a reference voltage with a desired drive specification (characteristics of the signal generated by the buffer, such as, signal settling time, magnitude of current provided, noise margin, etc.). The drive specification is generally determined from the expected load and its characteristics offered to the buffer.

The load offered to a buffer varies dynamically with respect to time in several environments. One problem with such varying load is that the reference voltage itself may vary due to the variation in the load. However, the buffer can be designed to settle to the desired reference voltage over time. There are several environments in which such settling duration needs to be short as described with reference to an analog to digital converter (ADC) below.

FIG. 1 is a block diagram of a pipeline ADC in one embodiment illustrating the need for a reference voltage which needs to settle to a desired magnitude within a short duration. ADC 100 is shown containing sample and hold amplifier (SHA) 110, stages 120-1 through 120-S, digital error correction block 130 and reference buffer 150. Each block is described below in further detail.

Reference buffer 150 generates a reference voltage (Vref) on path 152 typically from a constant DC voltage (e.g., bandgap reference voltage, well known in the relevant arts). The reference voltage can be in differential and/or single ended form depending on the requirements of the other components using the voltage. In order to avoid obscuring the features of the present invention, the description henceforth is provided with reference to single ended implementations. The extension of the approaches to differential circuits will be apparent to one skilled in the relevant arts by reading the disclosure provided herein, and such implementations are contemplated to be covered by various aspects of the present invention.

SHA 110 samples the input analog signal received on path 101 and holds the voltage level of the sample on path 111 for further processing. Digital error correction block 130 receives sub-codes from various stages (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is provided to stages 120-1 through 120-S. FIG. 2 further illustrates (logical) components contained in each stage (described with reference to stage 120-1 only, for conciseness) of a pipe line ADC according to a known approach.

With respect to FIG. 2, stage 120-1 is shown containing flash ADC 250, digital to analog converter (DAC) 260, subtractor 270 and gain amplifier 280. Flash ADC 250 (an example of a quantizer) converts a sample of an analog signal received on path 111 into a corresponding p-bit sub-code provided on path 256 (contained in path 123-1 of FIG. 1, and P is less than N). DAC 260 converts the sub-code received on path 256 into corresponding analog signal (Vdac) on path 267.

Subtractor 270 generates a residue signal as the difference of sample 111 (Vi) and the analog signal received on path 267. Gain amplifier 280 amplifies the residue signal (Vi-Vdac) and is provided on path 112 as an amplified residue signal. The signal on path 112 is used to resolve the remaining bits in the N-bit digital code by the subsequent stages of the ADC. The manner in which the residue signal is generated by each stage is described below with respect to FIGS. 3A and 3B.

FIG. 3A is a circuit diagram illustrating the manner in which DAC 260, subtractor 270, and gain amplifier 280 are implemented in an embodiment providing p-bit sub-codes and FIG. 3B is a timing diagram used to illustrate the sample and hold phases of the circuit. The circuit diagram is shown containing op-amp 350, feedback capacitor 360, feedback switch 380 and circuit portions 301-1 through 301-2$''$. Circuit portions 301-1 is shown containing sampling capacitor 330-1, switch 310A-1, 310B-1 and 310C-1. The remaining circuit portions 310-2 through 310-2$''$ may also contain similar components, and are not described in the interest of conciseness. Each component is described below in further details.

The circuit in FIG. 3A operates using two phase signals, shown as sampling phase 370 and hold phase 390. In the first phase (sampling phase 370) switches 310A-1 through 310A-2$''$ are closed at time points 371 and the remaining switches 380, 310B-1 through 310B-2$''$, and 310C-1 through 310C-2$''$ are kept open. As a result, each sampling (input) capacitor 330-1 through 330-2$''$ is ideally charged (in duration between 371–372) to the voltage of input sample received on path 111 by time point 372.

In the second phase (between durations 391–392), feedback switch 380 is closed and switches 310A-1 through 310A-2$''$ are kept open. Connections of switches 310B-1 through 310B-2$''$, and 310C-1 through 310C-2$''$ are made such that the input terminals of each sampling capacitors 330-1 through 330-2$''$ is connected either to Vref or to REFCM terminal, as determined from the output of flash ADC 250. As a result, capacitors 330-1 through 330-2$''$ transfers a charge proportional to the difference (residue) of input signal and the Vref or REFCM to feedback capacitor 360 (up to time point 392). The residue is amplified by op-amp 350 and provided as amplified residue signal to the next stage, as desired.

By examining the operation of the circuit, it may be appreciated that the magnitude of load offered during different hold phases (at every rising edge 391 to reference buffer 150 by the switched capacitor circuit of FIG. 3A) may be different (depending on the value of the sub-code). In particular, the capacitive load offered by the switched capacitor circuit (in durations 391–392) of FIG. 3A is given as:

$$C_L = C_1(Vref-Vin)/Vref \quad \text{Equation (1)}$$

wherein $C_n$ represents the capacitance value of all the capacitors connected to Vref, and Vin represents the sampled input voltage.

From Equation 1, it may be appreciated that one factor contributing to load variation is the varying voltage level (Vin) of the input signal. Another factor contributing to load variation is the number of capacitors connected to Vref (buffer 150 in the hold phase), which depends on the output of the quantizer (flash ADC 250). For example during hold phase(s) (between time points 391 and 392 of FIG. 3B), a selected number of sampling capacitors (based on the sub-code) are connected to the Vref and remaining capacitors are connected to REFCM terminal.

Accordingly, when the input signal equals Vref, the capacitive load offered by switched capacitor circuit of FIG. 3A may equal zero. Similarly, when the input signal has voltage level of 0, no capacitor is connected to Vref (since sub-code equals zero), thereby resulting again in zero capacitive load. However, when the input signal is between 0 and Vref, the capacitive load exhibits a quadratic relation with the input signal.

Due to such varying load, the effective reference voltage provided to switched capacitor amplifier circuit may be different in different conversion cycles (in hold phases in particular). One problem with such differences is, the generated digital codes could be non-linear (i.e., the generated code would not be proportionate to the voltage level of the input signal). Such non-linearity is often undesirable.

One known approach to reducing such non-linearity is to design reference buffer 150 to provide a charging current to charge load capacitors connected to the reference buffer (in this case, some of the capacitors 330-1 through 330-2″ based on quantizer output) to a desired reference voltage before occurrence of time point 392 in every hold phase.

However, at least for a high frequency operation of ADCs, it is generally desirable to keep the hold phase (391–392) short. Furthermore, the magnitude of the reference voltage provided to the capacitors needs to consistently equal a desired reference value before each edge 392. Such high frequency and accuracy can be attained by providing sufficient amount of current to capacitors 330-1 through 330-2″ instantaneously (or in short duration).

In one prior embodiment, such instantaneous current requirement is supported by connecting an external capacitor having a large value at the output of the reference buffer as illustrated in FIG. 4. The circuit shown there contains buffer 410, (large) capacitor 430, sampling capacitor 460 (representing the capacitive load offered by the switched capacitor amplifier of FIG. 3A, in the illustrative example above), resistor 470, and switches 481 and 482. Each component is described below in further detail.

Switches 481 and 482 connect sampling capacitor 460 to an input signal during sampling phase (371–372), and to reference signal/voltage during hold phase (391–392) respectively. Resistor 470 represents an output impedance of reference buffer 410. A voltage drop across the resistor 470 represents the droop (difference in the reference voltage offered between a no-load scenario and when a load is offered). The droop (voltage drop across resistor 470) increases with current drawn from buffer 410.

Large capacitor 430 is connected to the output of the reference buffer 410 (after output impedance 470). The large capacitor is charged (as shown by charging path 413) when load (sampling capacitor 460) is not connected (between time point 371 and 372) to the buffer. During hold phase, the required instantaneous current is supplied by the large capacitor (as shown by path 436) to sampling capacitor 460 (load). Thus, the buffer may merely need to provide an average charging current in the combination of sampling and hold phases to support the charge requirement of the external capacitor.

One recognised problem with the above approach is that the external (fabricated on a different die) capacitor is often connected to the switching load through a bond-pad (connecting interface), which generally offers an inductive impedance. Thus at higher conversion rate, the inductive impendence inhibits instantaneous current from external reference cap. Hence, such an approach may not be suitable for higher conversion rate switched capacitor data converters.

To overcome some of the related problems of the above approach, the large capacitor is built within (integrated into) the reference buffer output stage. However, the large size of the capacitors may present challenges in fabrication. The challenge may be appreciated by recognizing that an ADC generating N bit digital codes may require an internal capacitor having a capacitance of $(CLOAD*2^N)$, wherein CLOAD represents the total capacitive load. The total capacitive load is also proportion to $2^N$, and thus the required capacitance value increases rapidly with increased resolution (increasing N) requirements, and may be practically difficult to fabricate for sufficiently high value of N.

Therefore, what is needed is a method and apparatus which provides a reference voltage with desired accuracy in a short duration to a dynamically varying load.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

A voltage generation circuit provided according to an aspect of the present invention contains a first circuit and a second circuit, which provide a desired reference voltage in non-overlapping durations. Switches are provided to connect the outputs of the two circuits on a path on which the reference voltage is to be provided to an external component.

In an embodiment, the external component corresponds to a set of sampling capacitors (contained in a switched capacitor circuit of a stage of an ADC). In such an embodiment, the first circuit contains a first charging capacitor and the second circuit contains a second charging capacitor. The first charging capacitor may be designed to provide high current to charge the sampling capacitors to close the desired Vref level, and the second charging capacitor provide the necessary remaining charge to accurately attain the desired Vref level.

To support such charging capacitors, in an embodiment, the first circuit further contains a coarse buffer charging the first capacitor, and the second circuit further contains a fine buffer (charging the second capacitor) with a low output impedance (though a single buffer can be used to charge both the charging capacitors in an alternative embodiment). Due to the use of such combination of coarse and fine buffers, the implementation of the entire voltage generation circuit is simplified.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. General Reference Buffer

Figure 5:
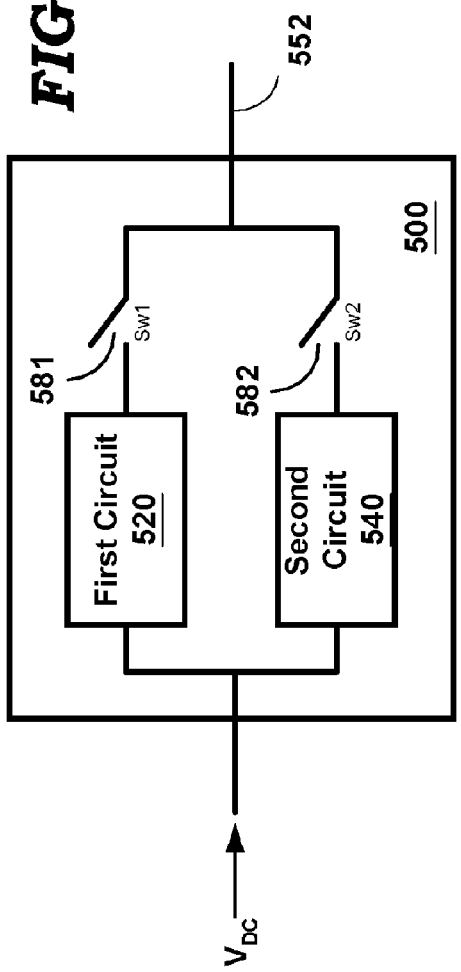
FIG. 5 is a block diagram illustrating the details of a reference buffer implemented according to an aspect of the present invention.

FIG. 5 is a block diagram illustrating the details of a reference buffer implemented according to an aspect of the present invention. Reference buffer 500 is shown containing a first circuit 520, a second circuit 540, and switches 581–582. Each block is described below in further detail.

Each of first circuit 520 and second circuit 540 receives a constant voltage ($V_{DC}$) from a constant voltage source such as band-gap reference as noted above. First circuit 520 generates a reference voltage with one drive specification and second circuit 540 generates the reference voltage with another drive specification. Switches 581 and 582 respectively operate to connect the output of first circuit 520 and second circuit 540 to path 552 in different time durations.

Figure 1:
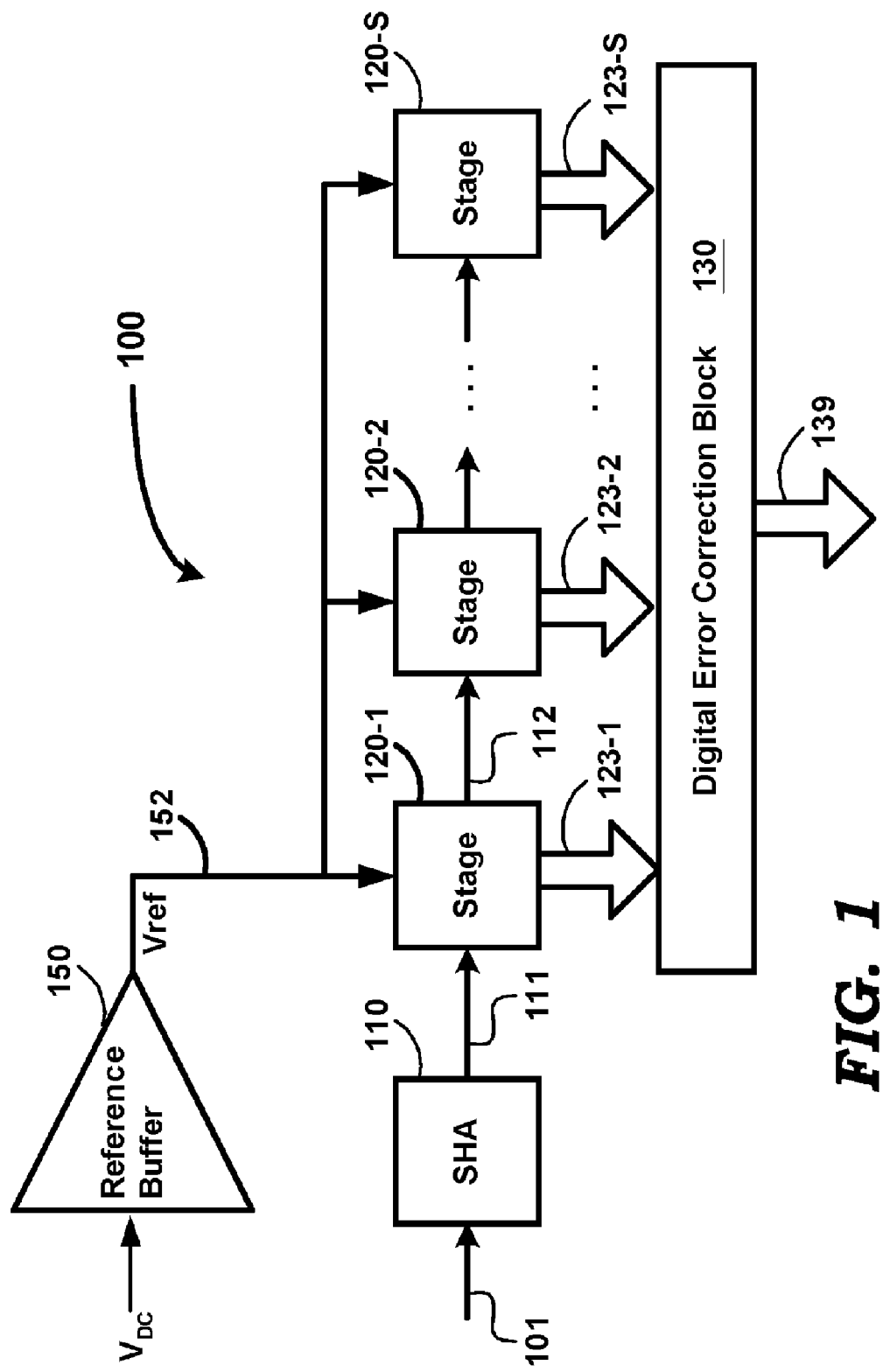
FIG. 1 is a block diagram illustrating the internal structure of an example prior multistage ADC.
Figure 2:
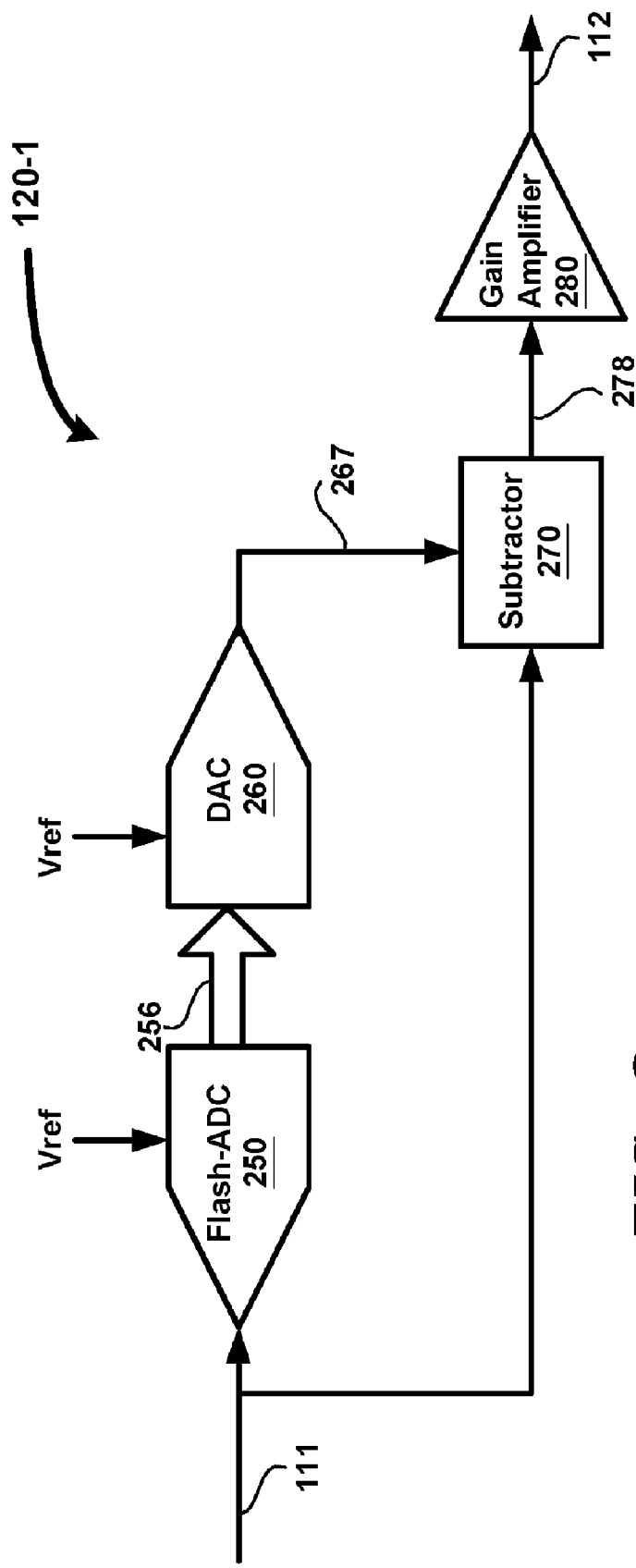
FIG. 2 is a block diagram illustrating the general operation of a stage of a prior ADC.
Figure 3A:
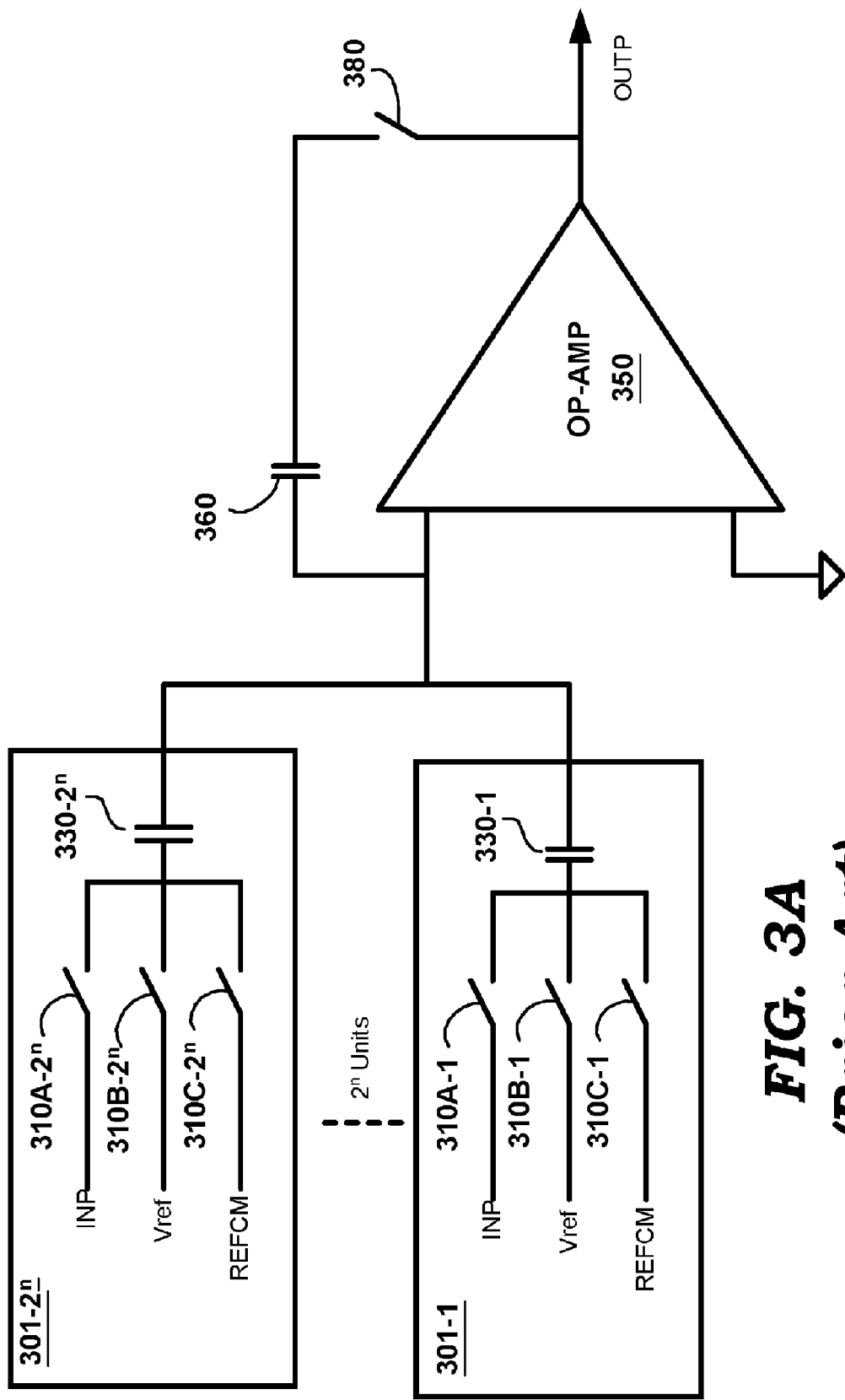
FIG. 3A is a circuit diagram of the implementation of a DAC, residue amplifier and a subtractor of a stage according to a prior approach.
Figure 3B:
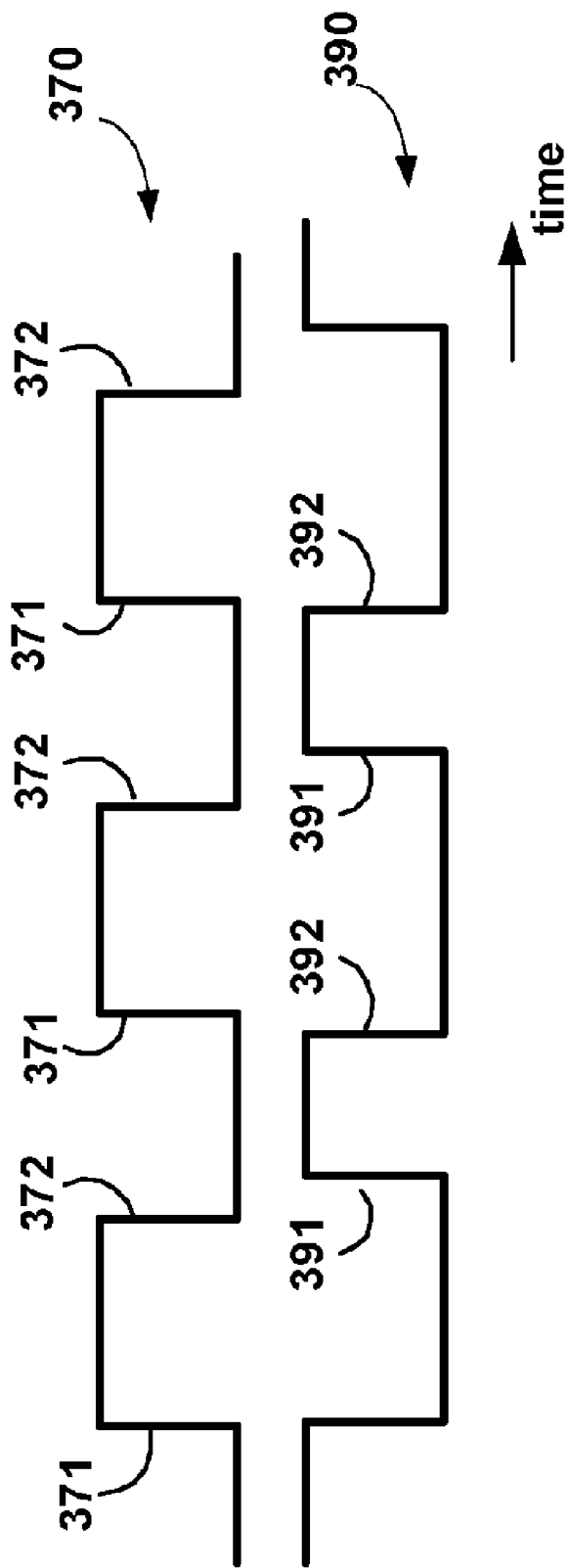
FIG. 3B is a timing diagram illustrating the sampling and hold phases of a stage of an ADC in one prior embodiment.

Accordingly the specification requirements (of the specific environment) may be suitably divided between first circuit 520 and second circuit 540, thereby potentially simplifying the implementation of both circuits. The embodiment of FIG. 5 can be adapted to address at least some of the requirements noted above with reference to the switched capacitor amplifier circuit of FIG. 3A, as described below.

3. Application to Switched Capacitor Amplifier Circuit

Figure 6:
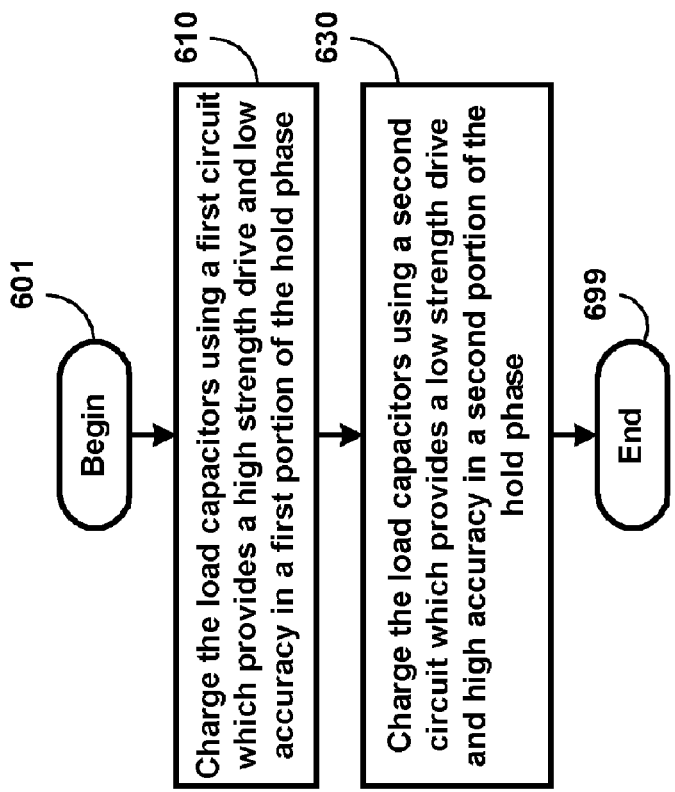
FIG. 6 is a flowchart illustrating the manner in which a reference buffer can be implemented to suit the requirements of a switched capacitor amplifier circuit provided in an analog to digital converter (ADC) in an embodiment of the present invention.

FIG. 6 is a flowchart illustrating the manner in which a reference buffer can be implemented to suit the requirements of a switched capacitor amplifier circuit provided in an analog to digital converter (ADC) in an embodiment of the present invention. The flowchart is described with reference to FIG. 4 for illustration. The flow chart begin in step 601 and control passes to step 610.

In step 610, the load capacitors (e.g., sampling capacitors 310A-1 through 310A-2") are charged using a first circuit (520) which provides a high drive and low accuracy in a first portion of the hold phase. In step 630, the load capacitors are charged using a second circuit (540) which provides a low drive and high accuracy in a second portion of the hold phase. The flowchart end in step 699.

Due to the use of the high drive in step 610, the load capacitors may be charged to close to Vref within a small fraction of the desired short duration of hold phase (391–392). On the other hand, due to the use of the high accuracy in step 630, the load capacitors may be charged accurately to the desired reference voltage. Since the first circuit need not have high accuracy and the second circuit need not have high drive, both the circuits may be easily fabricated. An example implementation consistent with the above description is described below with respect to FIG. 7.

4. Example Circuit

Figure 7:
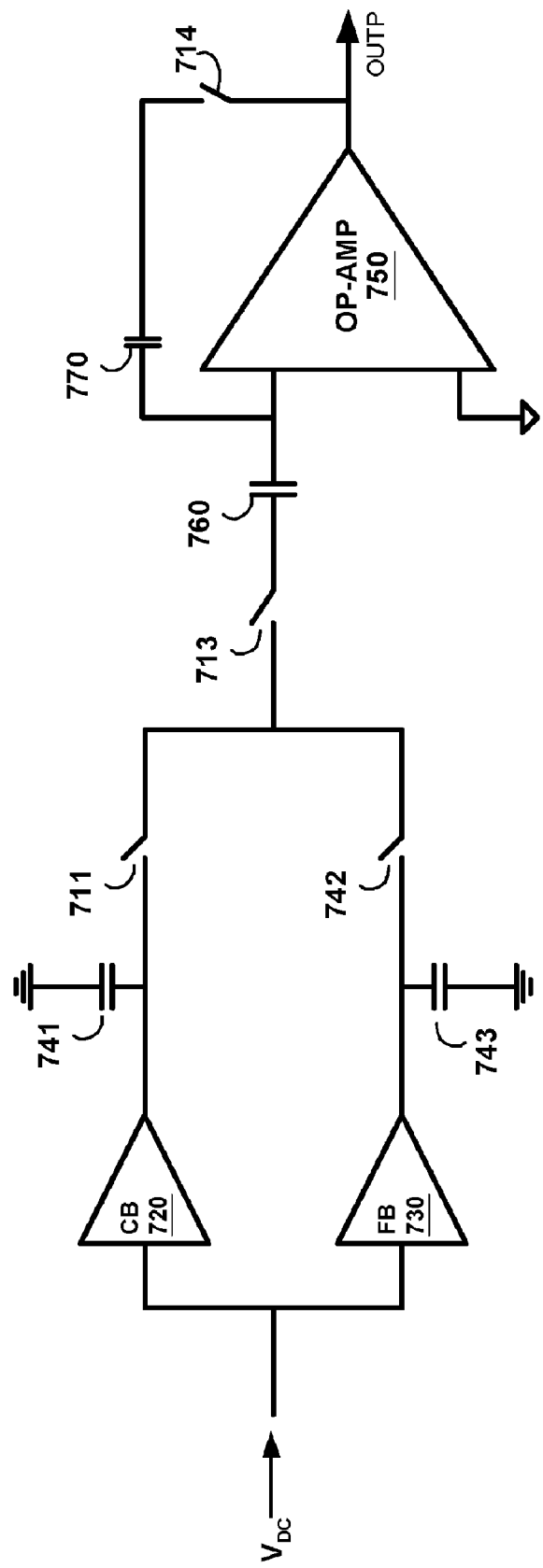
FIG. 7 is a circuit diagram illustrating the manner in which a desired reference voltage is provided in an embodiment of an analog to digital converter (ADC) according to an aspect of the present invention.

FIG. 7 is a circuit diagram illustrating the manner in which a desired reference voltage is provided in an embodiment of an analog to digital converter (ADC) according to an aspect of the present invention. The circuit diagram is shown containing coarse buffer (CB) 720, fine buffer (FB) 730, charging capacitors 741 and 742, switches 711–714, op-amp 750, feedback capacitor 770 and sampling capacitor 760. Each component is described below in further detail with combined reference to the timing diagram of FIG. 8.

Figure 8:
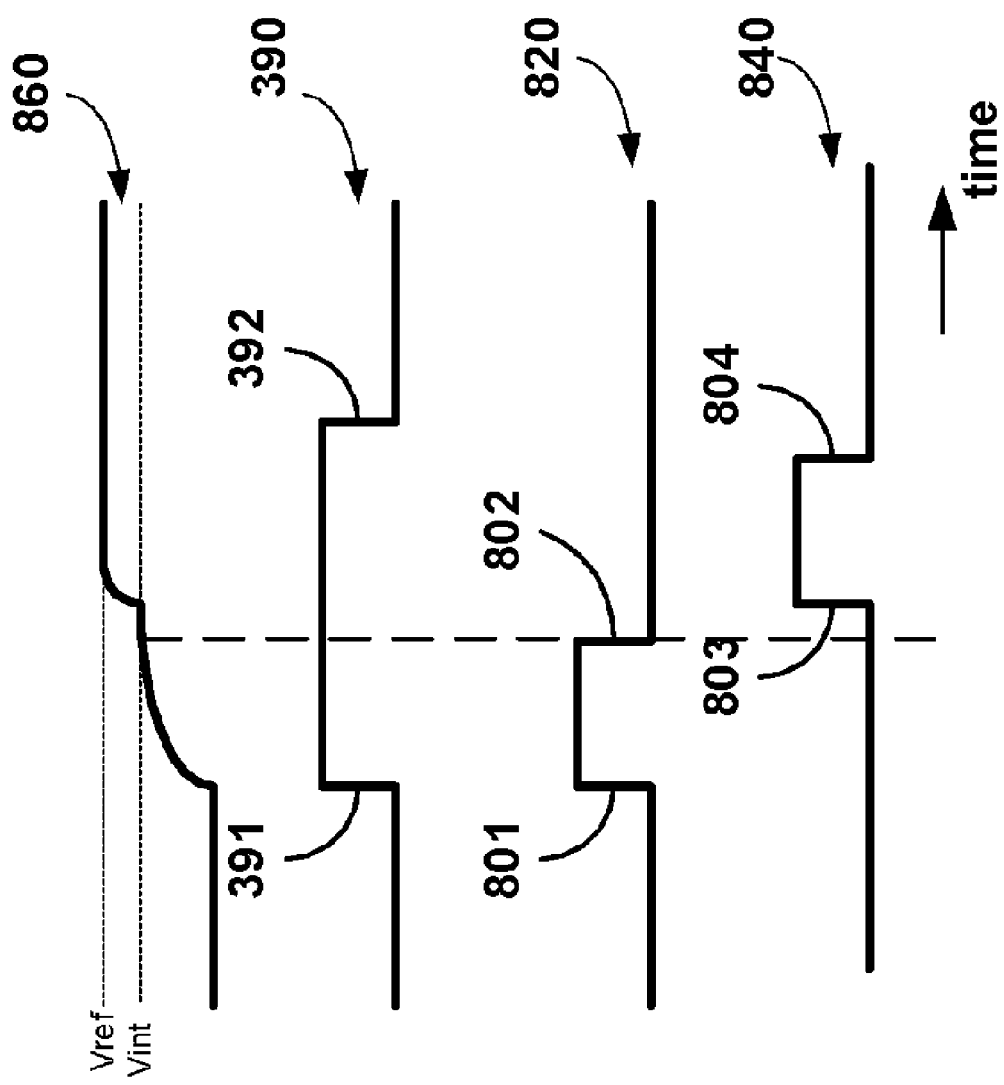
FIG. 8 is a timing diagram illustrating the manner in which a desired reference voltage is provided in an embodiment of an analog to digital converter (ADC) according to an aspect of the present invention.

FIG. 8 is a timing diagram illustrating the manner in which a desired reference voltage is provided in an embodiment of an analog to digital converter (ADC) according to an aspect of the present invention. Signal 390 represents the hold phase (active high), signal 820 represents the time duration (active high between time points 801 and 802) in which switch 711 is closed, signal 840 represents the time duration in which switch 712 is closed, and signal 860 represents the voltage level at the input of sampling capacitor 760.

Continuing with combined reference to FIGS. 7 and 8, during the entire hold phase, switches 713 and 714 may be closed, thereby connecting capacitors 760 and 770 respectively as a sampling capacitor and a feedback capacitor of a stage of an ADC for the desired amplification. It should be appreciated that sampling capacitor 760 represents any of the sampling capacitors which would need to be connected to reference voltage during the hold phase. Merely for conciseness, only one sampling capacitor is shown.

Coarse buffer (CB) 720 and charging capacitor 741 together represent first circuit 520. Briefly, coarse buffer 720 (providing high drive and low accuracy) charges (with an average charging current) charging capacitor 741 in both sampling and hold phases, and charging capacitor 741 discharges the stored energy quickly in sub-phase 801–802 of the hold phase (when the load is connected to the output of coarse buffer 720).

Similarly, fine buffer 730 and charging capacitor 742 together represent second circuit 540. Thus, fine buffer 730 is designed to provide high accuracy and low drive. Charging capacitor 742 discharges in sub-phase 803–804 to achieve the reference voltage with the desired accuracy. In an embodiment, both charging capacitors 741 and 742 are of equal order of magnitude, but substantially lower than a scenario in which a single capacitor drives the entire load in all durations.

Due to the operation of course buffer 720 and fine buffer 730, the voltage level at the input of sampling capacitor 760 rises in two sub-phases 801–802 and 803–804. In sub-phase 801–802, the voltage level raises rapidly (compared to in sub-phase 803–804) to an intermediate value Vint, close to the desired reference voltage. In sub-phase 803–804, the voltage level (at the input of sampling capacitor 760) reaches the desired reference voltage level (Vref) accurately in a short duration. There is a small non-overlapping duration between the two sub-phases, which avoids undesirable shorts.

Thus, the reference charging is split into two sub-phases (coarse and fine). In an embodiment, by the end of sub-phase one, switch capacitor load may be charged close to VREF with an error of a few mV (milli-volts). At this point in time, load/sampling capacitor 760 is switched from the coarse reference to fine reference. Thus, the effective charge provided by Fine reference comes down by a factor of 200–500 (VREF/few mV), assuming that the desired Vref is 2 Volts and the Vint equals 2–5 milli-volts less than Vref, in one embodiment.

It may be appreciated that the initial charging to Vint in sub-phase 801–802 requires large charging current, which would be provided by coarse buffer 720 (designed to provide high current). In sub-phase 803–804, the reference voltage needs to settle to the desired level accurately, and such accuracy is achieved by designing fine buffer 730 with less noise, low output impedance, etc.

Hence the design specifications of fine buffer 730 gets relaxed (or become less stringent), in the sense that output impedance can now be higher since the quantitative aggregate requirement of output current is reduced. With respect to coarse buffer 720, the noise specification is relaxed since the final accurate level needs to be reached only in the second sub-phase (by the operation of fine buffer). As a result, both buffers can be implemented/fabricated with relaxed requirements.

Figure 4:
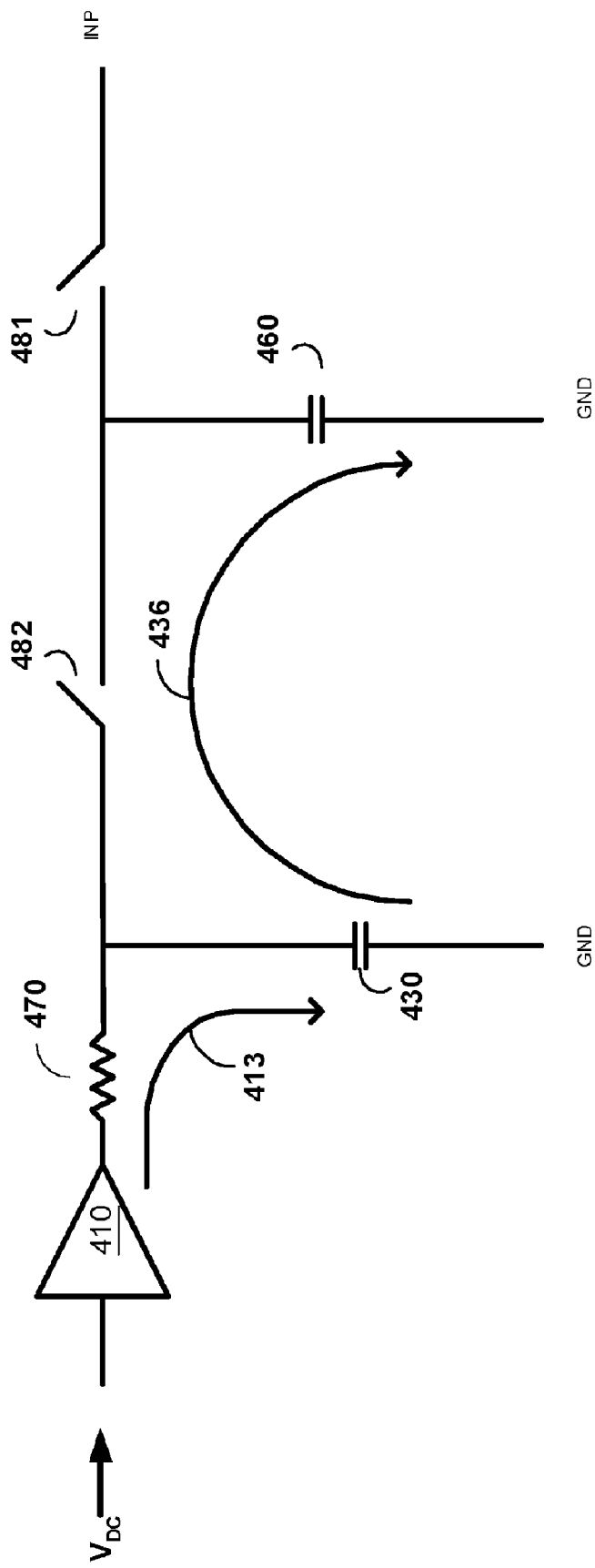
FIG. 4 is a circuit diagram illustrating the manner in which instantaneous (quick) current requirement for charging a sampling/load capacitor is supported in a prior embodiment.

Further, the magnitude of each charging capacitor 741 and 742 may also be reduced to $CLOAD*2^{N/2}$ and the aggregate capacitance value (of both capacitors 741 and 742) equals $2*CLOAD*2^{N/2}$ ($CLOAD*2^{(N/2)+1}$), wherein N equals the number of bits. In comparison, capacitor 430 of FIG. 4 is of capacitance $CLOAD*2^{N}$. Thus, the fabrication of individual capacitors is also simplified.

Also, since charging is performed in two different sub-phases by two different circuits, the drive specification (of each buffer) such as settling error requirement also gets divided by 2. For example, a specification of N bit, first circuit may be designed to provide a N/2 bit settling and second circuit may be designed to provide a remaining N/2 bits of settling.

As an illustration, in one embodiment, for a 16 bit settling requirement with effective load capacitance CLOAD=3 pF, the approach of FIG. 4 may require capacitor 430 of magnitude 197 nF. But with the approach of FIGS. 6–8, the same specification can be achieved with an internal capacitor of magnitude 1.6 nF in one embodiment.

The switch capacitor circuits thus implemented can be used in various devices. An example device is described below in further detail.

5. Device

Figure 9:
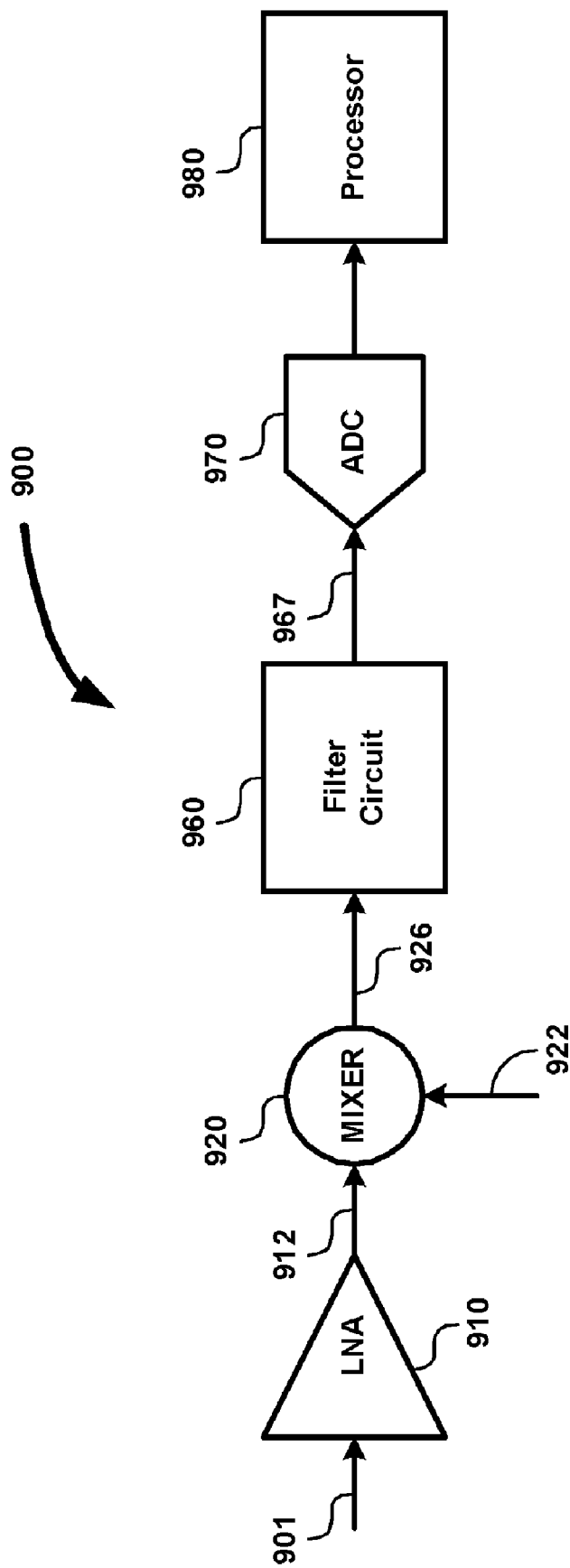
FIG. 9 is a block diagram of a receiver system illustrating an example system in which various aspects of the present invention may be implemented.

FIG. 9 is a block diagram of receiver system 900 illustrating an example system in which various aspects of the present invention may be implemented. For illustration, it is assumed that receiver system 900 is implemented within a Wireless Receiver. However, receiver system 900 can be implemented in other devices (wireless as well as wire-based communications) as well.

Receiver system 900 is shown containing low noise amplifiers (LNA) 910, mixer 920, filter circuit 960, analog to digital converter (ADC) 970, and processor 980. Each block/stage is described in further detail below.

LNA 910 receives signals on path 901 and amplifies the received signals to generate a corresponding amplified signal on path 912. For example, in wireless systems, the signals that are transmitted from satellites, etc. may be received by an antenna (not shown) and the received signals are provided on path 901. The received signals may be weak in strength and thus amplified by LNA 910 for further processing. LNA 910 may be implemented in a known way.

Mixer 920 may be used to down-convert the received amplified signal on path 912 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 920 may receive the amplified signal on path 912 and a signal of fixed frequency on path 922 as inputs, and provides the intermediate signal on path 926. The signal of fixed frequency on path 922 may be generated by a phase locked loop (not shown) in a known way.

Filter circuit 960 may correspond to a low pass filter, which allows the desired low frequencies and rejects all other unwanted high frequencies present in the signal received on line 926. The filtered signal, which contains the frequency band of interest, is provided on path 967.

ADC 970 converts (samples) the filtered signal received on path 967 to a corresponding digital value, which represents the signal of interest in received signal 901. Processor 980 processes the received digital values to provide various user applications and may be implemented as multiple processing units, each potentially operating independently. ADC 970 may be implemented according to various aspects of the present invention described above.

6. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A voltage generation circuit, in a switched-capacitor system, for coupling a reference voltage to an output node in a clock phase duration, the voltage generation circuit comprising:

a first circuit for generating an intermediate voltage contribution to the reference voltage;

a second circuit for generating an additional voltage contribution to the reference voltage; and a switch circuit for coupling the first circuit to the output node during a first duration less than the clock phase duration, and then for coupling the second circuit to the output node during a subsequent duration less than the clock phase duration.

2. The voltage generation circuit of claim 1, wherein the first duration and the subsequent duration are non-overlapping.

3. The voltage generation circuit of claim 2, wherein the switched-capacitor system comprises a switched-capacitor amplifier and at least one capacitor; and the at least one capacitor couples to the output node.

4. The voltage generation circuit of claim 3, wherein the first circuit comprises a first charging capacitor and the second circuit comprises a second charging capacitor, wherein the first charging capacitor is adapted and configured to discharge in the first duration and the second charging capacitor is adapted and configured to discharge in the subsequent duration, to couple the output node with the reference voltage.

5. The voltage generation circuit of claim 2, wherein the first circuit comprises a first amplifier with a first drive strength and a first accuracy; the second circuit comprises a second amplifier with a second drive strength and a second accuracy; and wherein the first drive strength is more than the second drive strength and the first accuracy is less than the second accuracy.

6. The voltage generation circuit of claim 5, further comprising a first capacitor coupled to be charged by the first amplifier, also the first capacitor coupled to be discharged to the output node in the first duration; and a second capacitor coupled to be charged by the second amplifier, also the second capacitor coupled to be discharged to the output node in the subsequent duration.

7. The voltage generation circuit of claim 5, wherein the switched-capacitor system comprises an analog-to-digital converter (ADC).

8. The voltage generation circuit of claim 5, wherein the first amplifier is configured to have more output impedance than the second amplifier.

9. The voltage generation circuit of claim 2, wherein the clock phase duration is adapted to contain the first duration and the subsequent duration.

10. The voltage generation circuit of claim 9, wherein the switched capacitor system comprises an analog-to-digital converter (ADC); and the clock phase duration is a signal hold phase of the ADC.

11. An apparatus for providing a reference voltage to an output node during a clock phase of a switched-capacitor system, the apparatus comprising:
means for generating an intermediate voltage contribution to the reference voltage;
means for generating an additional voltage contribution to the reference voltage;
means for coupling the intermediate voltage contribution to the output node in a first duration of the clock phase; and
means for coupling the additional voltage contribution to the output node in a subsequent duration of the clock phase.

12. A method of providing a reference voltage to an output node for a switched-capacitor system, during a first duration and a subsequent duration related to a clock phase; the method comprising the steps of:
generating an intermediate voltage contribution to the reference voltage;
generating an additional voltage contribution to the reference voltage;
coupling the intermediate voltage contribution to the output node in the first duration; and
coupling the additional voltage contribution to the output node in the subsequent duration; wherein the first and the subsequent durations are less than the clock phase duration.

13. The method of claim 12, wherein the first circuit comprises a first charging capacitor and the second circuit comprises a second charging capacitor, wherein the first capacitor discharges in the first duration and the second capacitor discharges in the subsequent duration, to couple the output node with the reference voltage.

14. The method of claim 13, wherein the first charging capacitor is charged by a first amplifier with a coarse accuracy; and the second charging capacitor is charged by a second amplifier with a fine accuracy.

15. The method of claim 14, wherein the clock phase duration is adapted to contain the first duration and the subsequent duration.

16. The method of claim 15, wherein the switched-capacitor system comprise an analog-to-digital converter.

17. A voltage generation circuit, in a switched-capacitor system, for coupling a reference voltage to an output node in a clock phase, the voltage generation circuit comprising:
a first circuit for generating an intermediate voltage contribution to the reference voltage;
a second circuit for generating an additional voltage contribution to the reference voltage; and
a switch circuit for coupling the first circuit to the output node during a first duration of the clock phase, and then for coupling the second circuit to the output node during a subsequent duration of the clock phase duration; and the first duration and subsequent duration are adapted to be non-overlapping durations.

18. The voltage generation circuit of claim 17, wherein the first circuit comprises a first amplifier and a first capacitor; the second circuit comprises a second amplifier and a second capacitor.

19. The voltage generation circuit of claim 18, wherein the first amplifier is configured to have a first drive strength and first accuracy; and the second amplifier is configured to have a second drive strength and a second accuracy; and the first drive strength is more than the second drive strength and the first accuracy is less than the second accuracy.

20. The voltage generation circuit of claim 19, wherein the first capacitor is coupled to be charged by the first amplifier, the first capacitor coupled to be discharged to the output node in the first duration; and the second capacitor is coupled to be charged by the second amplifier, the second capacitor to be discharged to the output node in the subsequent duration.

21. The voltage generation circuit of claim 20, wherein the switched-capacitor system is an analog-to-digital converter (ADC) which is adapted to sample a signal during a sampling phase and to hold a signal during a hold phase.

22. The voltage generation circuit of claim 21, wherein the clock phase is the hold phase of the ADC.

* * * * *